United States Patent [19]

Jones

[11] Patent Number: 4,520,269

[45] Date of Patent: May 28, 1985

[54] ELECTRON BEAM LITHOGRAPHY PROXIMITY CORRECTION METHOD

[75] Inventor: Fletcher Jones, Ossining, N.Y.

[73] Assignee: International Business Machines Corporation, Armonk, N.Y.

[21] Appl. No.: 439,241

[22] Filed: Nov. 3, 1982

[51] Int. Cl.$^3$ ............................................... H01J 3/26
[52] U.S. Cl. .................................. 250/492.2; 430/296
[58] Field of Search ............... 250/492.2, 492.1, 492.3; 430/296

[56] References Cited

U.S. PATENT DOCUMENTS

| | | | |
|---|---|---|---|
| 4,264,711 | 4/1981 | Greeneich | 430/296 |
| 4,426,584 | 1/1984 | Bohlen et al. | 250/492.2 |

FOREIGN PATENT DOCUMENTS

| | | | |
|---|---|---|---|
| 55-41785 | 3/1980 | Japan | 430/296 |
| 55-56629 | 4/1980 | Japan | 430/296 |
| 57-12520 | 1/1982 | Japan | 430/296 |
| 57-45261 | 3/1982 | Japan | 430/296 |
| 57-103318 | 6/1982 | Japan | 430/296 |
| 58-61628 | 4/1983 | Japan | 430/296 |

*Primary Examiner*—Alfred E. Smith
*Assistant Examiner*—Richard Hanig
*Attorney, Agent, or Firm*—Ronald L. Drumheller

[57] ABSTRACT

Proximity effect is reduced or eliminated by breaking each shape of a lithographic exposure pattern into two parts, a perimeter part having a width on the order of the lithographic exposure pattern minimum linewidth and the remaining central part or parts (if any) which are completely surrounded by the perimeter part. The lithographic exposure pattern is then modified by moving or setting back the edges of each central part away from the perimeter part which surrounds it (similar to reducing the size of the central part) to form a nominally unexposed band separating each central part from the perimeter part which surrounds it.

The width of the nominally unexposed band in the modified exposure pattern is preferably chosen as large as possible so long as the condition is met that upon developing a radiation sensitive layer directly exposed to the modified exposure pattern, the nominally unexposed band develops (i.e., dissolves, resists dissolution, or is otherwise modified) substantially as if it were also exposed. The nominally unexposed band is exposed, in fact, by electrons scattered from the directly exposed part(s) of the shape (the perimeter part plus the central part, if any). The width of the nominally unexposed band is preferably about twice the edge bias applied to outside edges of each shape.

19 Claims, 18 Drawing Figures

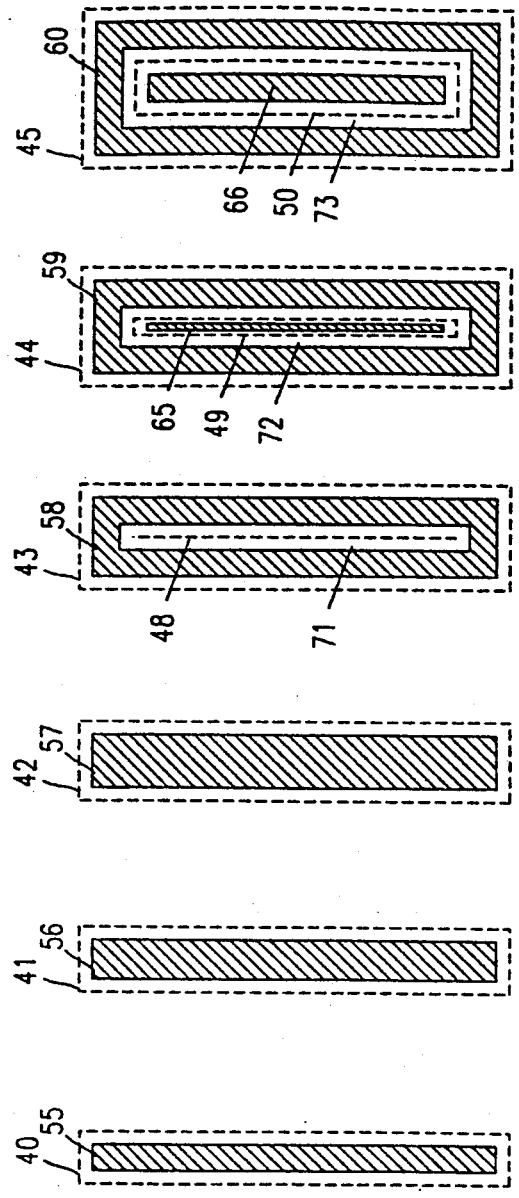

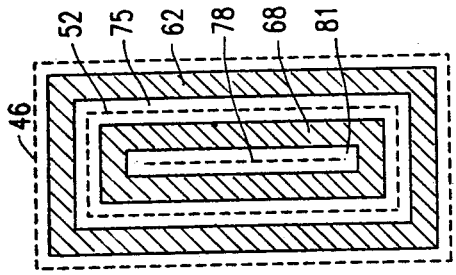
FIG.5.8
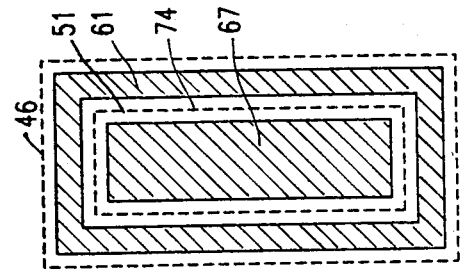
FIG.5.7
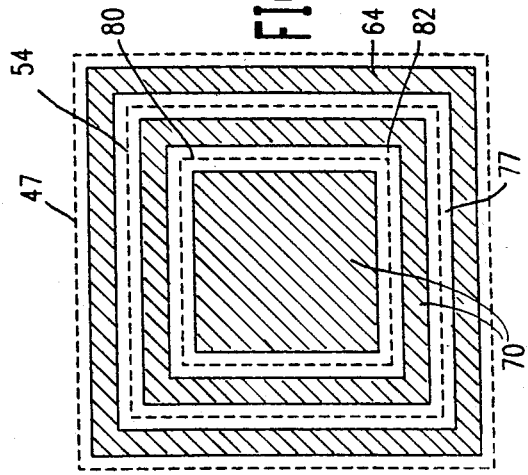
FIG.5.10
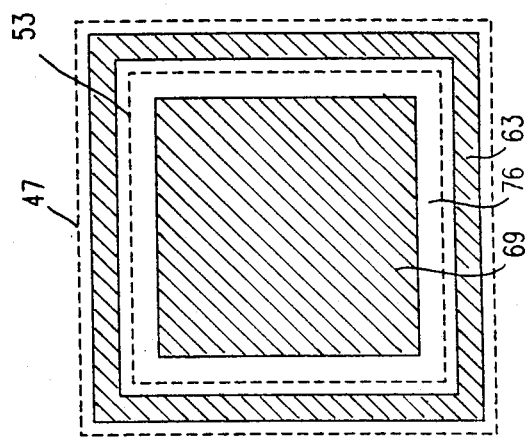
FIG.5.9

ELECTRON BEAM LITHOGRAPHY PROXIMITY CORRECTION METHOD

DESCRIPTION

1. Technical Field

This invention relates to proximity effect correction methods for electron beam lithography and more particularly to a method for reducing or eliminating electron beam proximity effects without needing to vary the electron beam exposure dose.

2. Background Art

Electron beams can be formed with a very small diameter and have been used to form very high resolution patterns for microcircuit fabrication. Small diameter electron beams have been used not only as a direct writing lithography tool during fabrication of high density microcircuits but also indirectly to form high resolution masks for use in fabricating microcircuits.

When an electron beam penetrates a material, such as an electron beam sensitive resist, the high energy primary electrons in the beam collide with molecules in the material and become laterally deflected or scattered in a random process. Secondary electrons are also released by the collisions and travel not only in the forward direction but also laterally and in the backward direction. Back scattering of secondary electrons is particularly great at material interfaces such as the boundary between an electron beam sensitive resist and a supporting substrate. The lateral spreading of the primary and secondary electrons causes nearby lateral regions to be exposed to scattered electrons. When two regions to be exposed are positioned close together, each receives not only the direct electron beam exposure during irradiation of that region, but also an extra dose of electron beam exposure due to the lateral scattering or spreading of electrons during exposure of the adjacent region. As a result, closely adjacent regions become more heavily exposed from the same incident dose than do isolated regions. Accordingly, without dose correction, electron beam sensitive resists develop differently in electron beam exposed regions which are adjacent to other electron beam exposed regions than in isolated electron beam exposed regions. This has become known as the proximity effect.

The prior art method for avoiding proximity effects is to compensate for the expected added exposure contributed by electrons scattered from adjacent regions by correspondingly reducing the incident exposure dose of the region. Elaborate computer programs have been developed which calculate the dose needed at each elemental region of a complex pattern so as to get a substantially uniform total exposure everywhere in the pattern. Isolated regions get a greater incident exposure than regions adjacent to other regions.

While this technique is highly effective, it is also rather expensive due to the high cost of developing such programs and the extra expense in making the extensive computer calculations required, storing the dose data, and developing, fabricating and maintaining electron beam equipment having a computer controlled variable dose capability.

Another problem with the prior art technique of varying the exposure dose in order to compensate for proximity effect is that this technique cannot be used at all when the exposure process inherently produces a uniform incident exposure dose everywhere in the exposure pattern. This usually occurs, for example, when the electron beam is raster scanned rather than vector scanned. It occurs also when a mask is illuminated with an electron flood beam to form an electron beam exposure pattern and when a patterned layer directly emits a pattern of electrons. Such electron beam shadow masks and patterned electron emitters are not in practical use at this time but future development of such techniques is possible.

It is an object of this invention to provide a method for reducing or eliminating electron beam proximity effects which does not require that the applied exposure dose be varied.

Another object is to provide a method for reducing or eliminating electron beam proximity effects which does not require a computation of the exposure contribution from adjacent shapes due to lateral scattering effects.

DISCLOSURE OF THE INVENTION

Proximity effect is reduced or eliminated in accordance with this invention by breaking each shape of a lithographic exposure pattern into two parts, a perimeter part having a width on the order of the lithographic exposure pattern minimum linewidth and the remaining central part or parts (if any) which are completely surrounded by the perimeter part. Very narrow shapes (such as lines of a width near the minimum linewidth) will have no central part. Many shapes will have at least one remaining central part. The lithographic exposure pattern is then modified by moving or setting back the edges of each central part away from the perimeter part which surrounds it (similar to reducing the size of the central part) to form a nominally unexposed band separating each central part from the perimeter part which surrounds it.

The width of the nominally unexposed band in the modified exposure pattern is preferably chosen as large as possible so long as the condition is met that upon developing a radiation sensitive layer directly exposed to the modified exposure pattern, the nominally unexposed band develops (i.e., dissolves, resists dissolution, or is otherwise modified) substantially as if it were also exposed. The nominally unexposed band is exposed, in fact, by electrons scattered from the directly exposed part(s) of the shape (the perimeter part plus the central part, if any). The appropriate width of the nominally unexposed band usually turns out to be about twice the edge bias applied to outside edges of each shape. The appropriate width will be larger when the central part is very large.

The nominally unexposed band acts to reduce the number of secondary, backscattered and deflected electrons arising from irradiation of a shape from reaching regions outside the perimeter part of the shape, particularly those arising from irradiation of the central part(s) of the shape. As a result, adverse proximity effects between adjacent shapes is remarkably reduced.

In order to further reduce proximity effects, large shapes may be further subdivided by dividing each large central part into a perimeter subpart and a central subpart (if any), the edges of each central subpart again being set back away from the perimeter subpart which surrounds it to form an additional nominally unexposed band separating each central subpart from the perimeter subpart which surrounds it. This results in a pattern of nested perimeter lines spaced from each other by nominally unexposed bands, all of which may or may not surround a remaining inner part.

BRIEF DESCRIPTION OF THE DRAWINGS

FIGS. 5.1–5.10 illustrate exposure patterns for a line shape of different widths.

BEST MODE OF CARRYING OUT THE INVENTION

Figure 1:
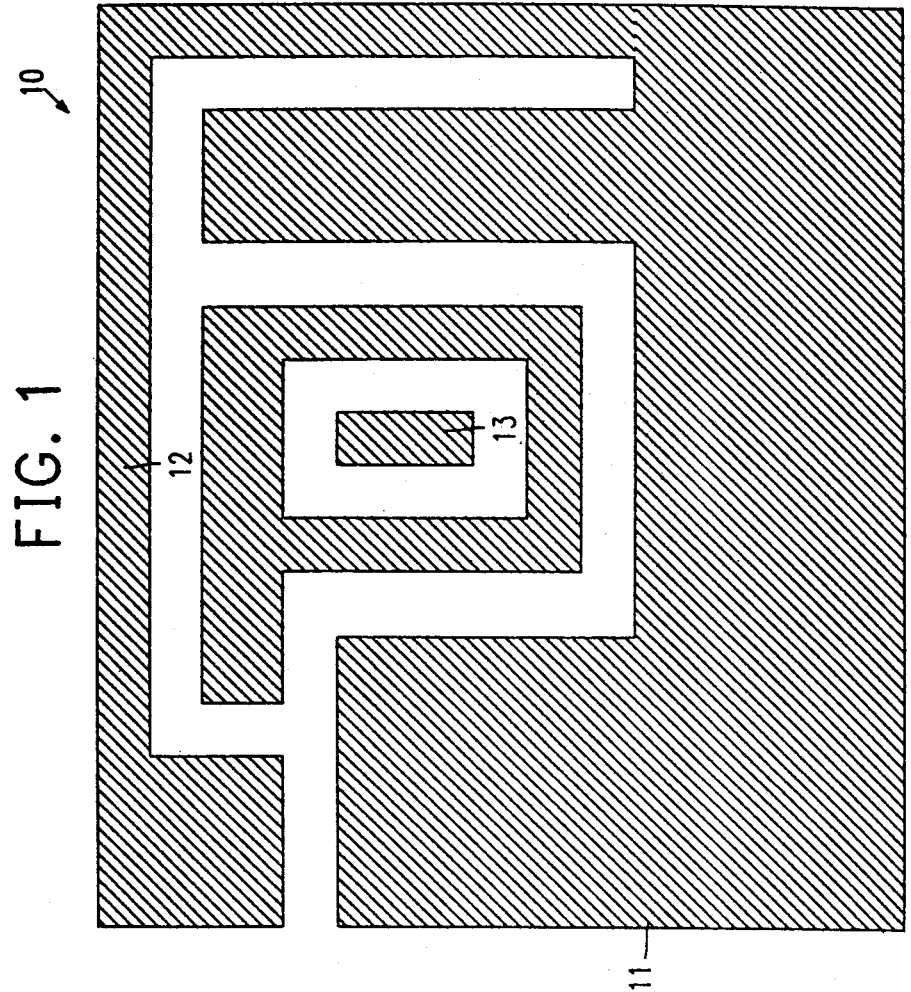
FIG. 1 illustrates an exemplary lithographic pattern to be formed.

FIG. 1 shows an exemplary lithographic pattern 10 with respect to which the invention now will be described. Lithographic pattern 10 will be modified to produce a proximity corrected exposure pattern such that when a radiation sensitive layer, such as a positive acting electron beam resist, is exposed directly with the modified pattern and then developed, the lithographic pattern 10 is produced.

In accordance with this invention, each shape of the pattern is divided into a perimeter part having a width on the order of the lithographic exposure pattern minimum linewidth and the remaining central part or parts, if any. It will be assumed that the lithographic pattern to be so divided consists of the shaded parts 11, 12, 13 of FIG. 1 and that a positive acting exposure and development process will be used.

Figure 2:
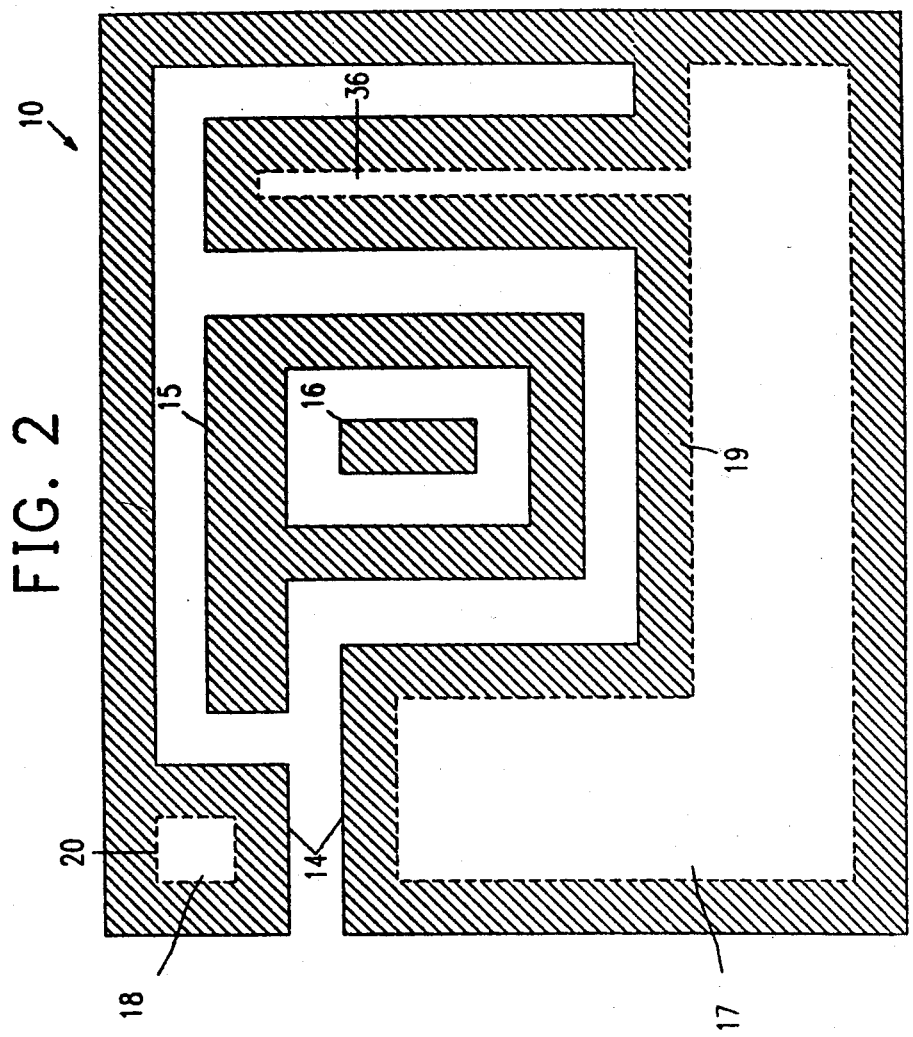
FIG. 2 shows the pattern of FIG. 1 divided into perimeter parts and central parts in accordance with one embodiment of this invention.

In FIG. 2, the perimeter parts 14, 15, 16 of the pattern are shaded. The unshaded parts 17, 18 inside of the dotted lines 19, 20 are central parts. This pattern (FIG. 2) was formed by moving a fixed distance perpendicularly inward from all edges of the shaded pattern in FIG. 1 and forming a dotted interface line at that position defining central parts. Parts of the pattern which are no wider than twice this fixed distance have only a perimeter part and no dotted interface line defining a central part. The fixed distance (width of the perimeter border parts was arbitrarily made equal to the width of the narrow lines in the lithographic pattern shown in FIG. 1. A wider or narrower distance could have been chosen so long as it is on the order of the exposure pattern minimum linewidth.

As will become more apparent, the exposure pattern minimum linewidth is not the same as the lithographic pattern minimum linewidth. The exposure pattern minimum linewidth is the width of the most narrow lines in the exposure pattern (minimum width of either exposed or unexposed lines) while the lithography pattern minimum linewidth is the width of the most narrow lines in the developed pattern (minimum width of developed lines or spaces). The two are different in general by twice the edge bias amount.

When a radiation sensitive layer is exposed to a pattern of actinic radiation and then is developed, exposed shapes in the pattern develop to a size (width and length) which is somewhat larger than the directly exposed shape size. To compensate for this enlarging effect, edges of the exposure shapes are deliberately set back or moved by a corresponding distance in the opposite direction. This is called "edge bias". During development the edges move back to the desired position. The appropriate amount of edge bias generally varies with process variables such as the layer thickness and composition, the developer concentration and composition and the effective exposure dose of the shape.

In every lithographic exposure and development process, an edge bias is applied at some point. As will become more clear, the perimeter parts and central parts may be defined either before or after edge bias is applied to edges of a lithographic pattern. In FIG. 2, the perimeter parts and central parts have been defined before any edge bias is applied to the lithographic pattern of FIG. 1. Edge bias is then applied in the next step.

Ordinarily, edge biasing is applied to all edges of a lithographic pattern. One way of viewing the present invention is that edge bias is applied not only to the edges which were already present in the lithographic pattern, but also to the new edges formed by dividing the pattern into perimeter parts and central parts, namely the newly defined inside edges of perimeter parts (those perimeter part edges adjacent to and defining a central part) and the outside edges of central parts.

Figure 3:
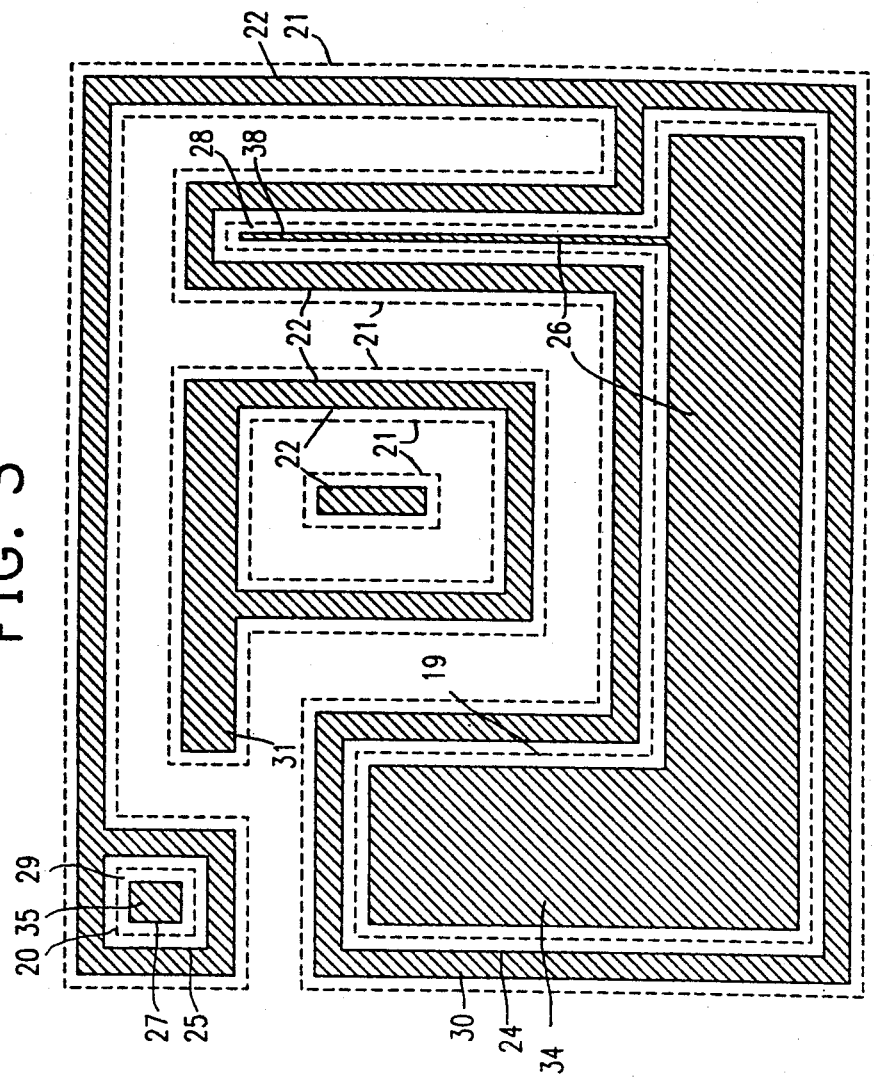
FIG. 3 illustrates a proximity corrected exposure pattern formed in accordance with this invention from the parts shown in FIG. 2.

This is illustrated in FIG. 3. The dotted lines 21 in FIG. 3 represent the borders of the pattern of FIG. 1. Each of these borders has been moved perpendicularly inward by a fixed distance (the edge bias) to form a new border 22. The dotted lines 19, 20 in FIG. 3 represent the interfaces between central parts 17, 18 and the surrounding perimeter parts in FIG. 2. Accordingly interfaces 19, 20 each simultaneously represent also a newly defined inside edge of a perimeter part and a newly defined outside edge of a central part. In FIG. 3 the newly defined inside edges of the perimeter parts have been moved perpendicularly away from the corresponding interface line to form exposure pattern edges 24, 25. The newly defined outside edges of the central parts have been moved perpendicularly away in the other direction from the corresponding interface line to form exposure pattern edges 26, 27. By biasing the newly defined perimeter inside edges and central part outside edges in opposite directions, nominally unexposed bands 28, 29 are formed between the edge biased perimeter parts 30, 31, 32 and the edge biased central parts 34, 35.

The proximity corrected exposure pattern comprises the edge biased perimeter parts and the edge biased central parts. Bands 28, 29 are not directly exposed even though they correspond to regions within the lithographic pattern. Although bands 28, 29 are nominally unexposed, they are nevertheless exposed to electrons scattered from the adjacent central and perimeter parts during exposure of the central and perimeter parts. Since biased edges return to their prebiased position upon development by definition (the amount of edge bias is selected such that this will happen), a radiation sensitive layer exposed to the shaded pattern shown in FIG. 3 will develop into the desired lithographic pattern shown in FIG. 1.

Ordinarily the edge biasing both outside a shape and on both sides of the interface line between the central and perimeter parts may be the same. Special situations may arise, however, where a wider or narrower bias is more appropriate. For example, in the illustrated pattern in FIG. 2 arm 36 of central part 17 has a width which turns out to be so narrow that edge biasing both sides of this arm by the same amount as the other edges would result in no remaining width to central part arm 28. The edge bias here has been reduced so that there remains a narrow part 38 of minimum width. It might also be appropriate to increase the edge bias applied to a central part when the central part is very wide. This is justified because large central parts produce relatively more scattering and will be able to expose through scattering a wider nominally unexposed region.

Figure 4:
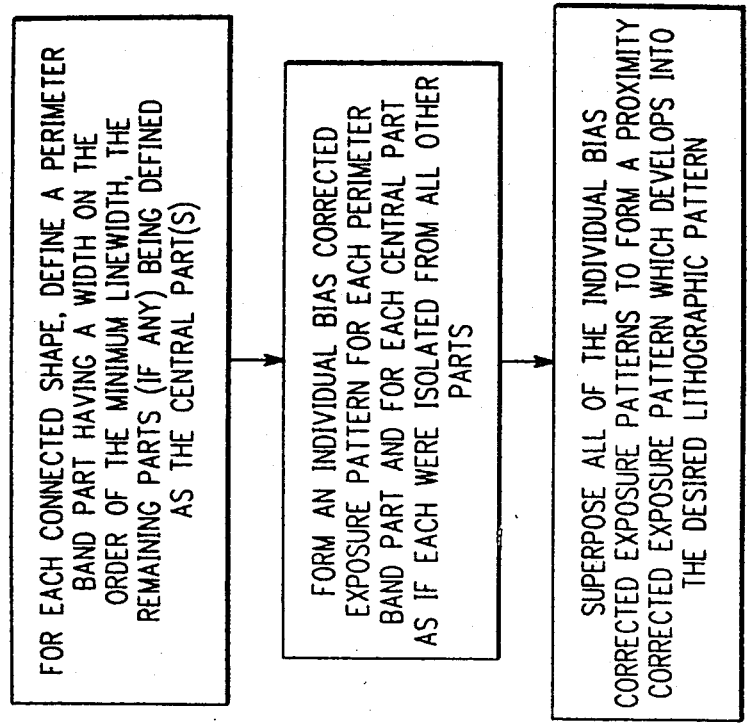
FIG. 4 is a block diagram of the method illustrated by FIG. 3.

FIG. 4 illustrates in block diagram the method already described by reference to FIGS. 1-3. FIG. 1 shows a pattern having three shapes 11, 12, 13, each of which will be called a connected shape to distinguish such shapes from the individual shapes which are obtained when a shape is partitioned into two or more elementary or primitive shapes. A connected shape may be defined as a region which is connected together and is connected to no other shape. It is characterized in that it has a continuous perimeter edge surrounding it which does not pass through the interior of a pattern part. Partitioned shapes do not have this characteristic and will be considered later.

In accordance with the method illustrated by FIGS. 1-3 for each connected shape of the desired lithographic pattern a perimeter band part is defined having a width on the order of the minimum linewidth, the remaining parts (if any) being defined as central part(s). An individual edge bias corrected exposure pattern is then formed for each perimeter band part and for each central part as if each were isolated from all other parts. Finally, all of the individual bias corrected exposure patterns are superposed, thereby forming a proximity corrected exposure pattern which develops into the desired lithographic pattern.

FIGS. 5.1-5.10 illustrate how this method is applied to a rectangular shape of increasing width. In FIG. 5.1, the desired shape 40 (dotted) has what will be assumed to be the minimum lithographic pattern linewidth. The appropriate edge bias is assumed to be one-quarter of this width.

Shapes 41-47 (also dotted) are progressively wider and are shown in FIGS. 5.2-5.7, 5.9. Shape 46 is shown in both FIGS. 5.7 and 5.8. Similarly, shape 47 is shown in both FIGS. 5.8 and 5.10.

Each of the rectangular shapes has been first subdivided into a perimeter part and a central part, if possible. The shapes in FIGS. 5.1-5.3 are too narrow to have a separate central part. In FIG. 5.4, the central part has no width or area and is illustrated by the dotted interface line 48 having no enclosed area. FIGS. 5.5-5.10 all have an interface line defining an enclosed central part. These interface lines are dotted and labelled 49-54 respectively. In each case where a dotted interface line is illustrated, it is the same distance (minimum linewidth) from the dotted outside edge of the rectangular shape, forming a perimeter band part each time having the same width.

The perimeter parts (the parts between a dotted rectangular shape 40-47 and a dotted interface, if any, 48-54) have been edge biased by the same amount (one-quarter of the minimum linewidth) to form exposure patterns 55-64. Each central part having width (the parts inside of a dotted interface 49-54) have also been edge biased and form exposure patterns 65-70. The edge bias for the outside edge of each central part is also equal to one-quarter of the minimum linewidth except in FIGS. 5.5 and 5.9. The central part in FIG. 5.5 is too small to have the same bias. The nominally unexposed central region 71 in FIG. 5.4 is as wide as it can be and still receive the needed scattered electron exposure during subsequent pattern exposure. When the central unexposed region gets larger (FIG. 5.5), it becomes necessary to expose at least a narrow line 65 down the middle. In FIG. 5.9, the central exposed region 69 is so large that an increased bias can be used. Accordingly, the outside bias of the central part in FIG. 5.9 has been increased to one-half of the minimum linewidth.

In FIGS. 5.8 and 5.10, the central parts are further treated as individual shapes by further subdividing the central parts into perimeter subparts and central subparts. Additional interfaces 78, 80 define the central subparts enclosed thereby. The perimeter subparts lie between interfaces 78 and 52 (FIG. 5.8) and between interfaces 80 and 54 (FIG. 5.10). Interface 78 defines a central subpart having no area just like interface 48 in FIG. 5.4. The further subdividing of central parts is treated similarly to the original subdividing of shapes. Still further subdivision of central subparts is possible but is not expected to substantially improve proximity correction. Nominally unexposed bands in the FIGS. 5.1-5.10 are labelled 71-77, 81 and 82.

Figure 6:
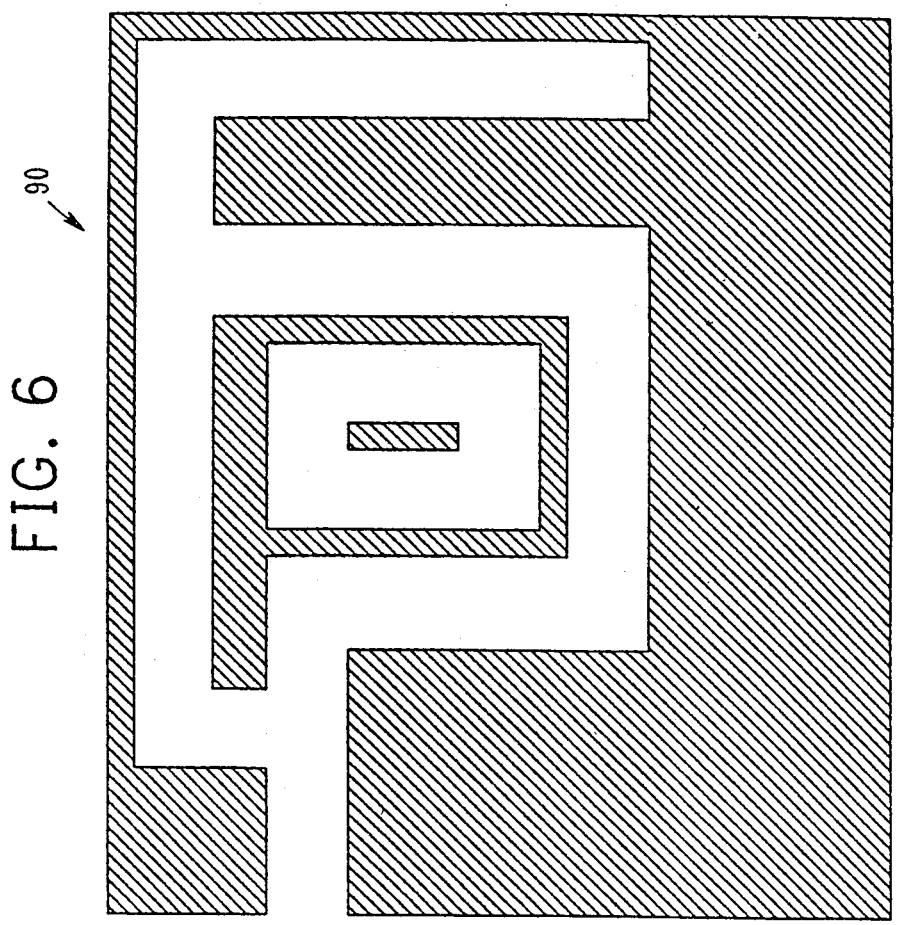
FIG. 6 shows the pattern of FIG. 1 with edge bias applied.
Figure 7:
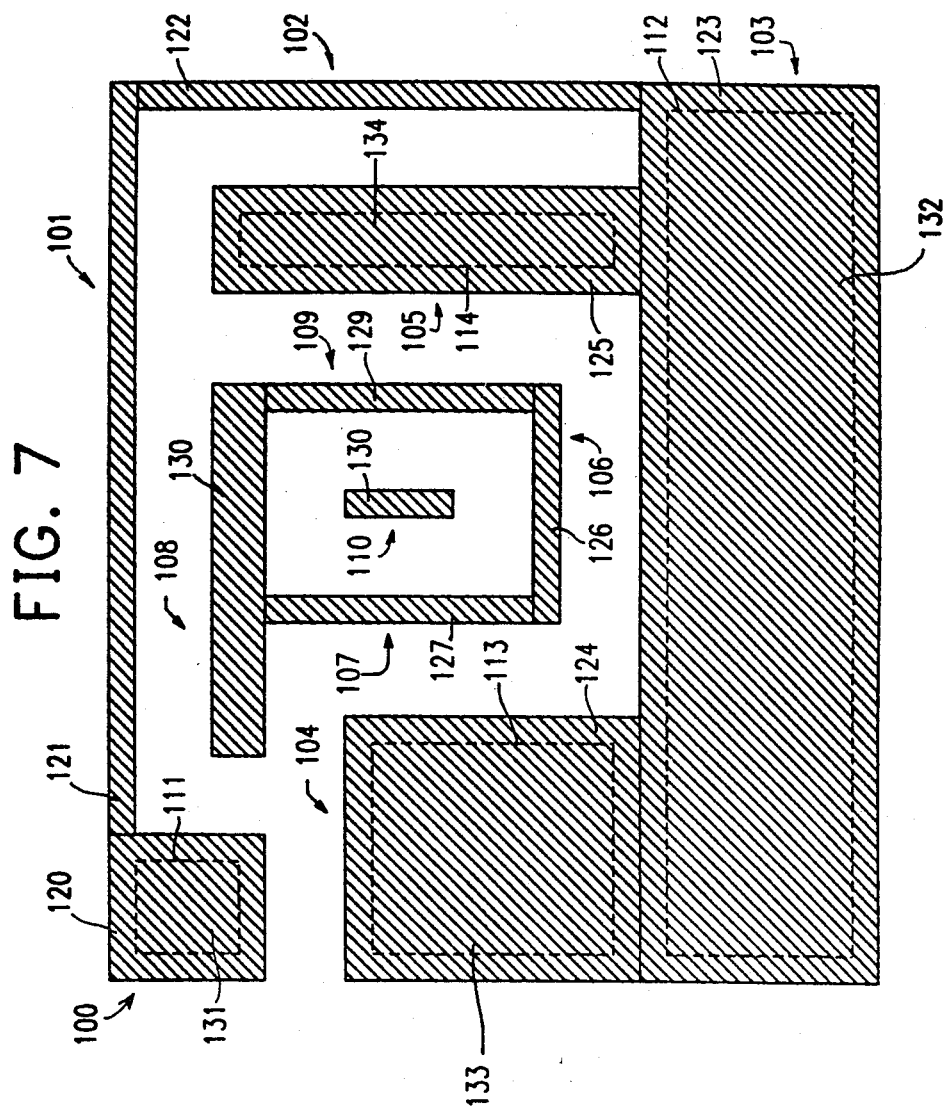
FIG. 7 shows the pattern of FIG. 6 partitioned into rectangles and the rectangles divided into perimeter parts and central parts in accordance with another embodiment of this invention.
Figure 8:
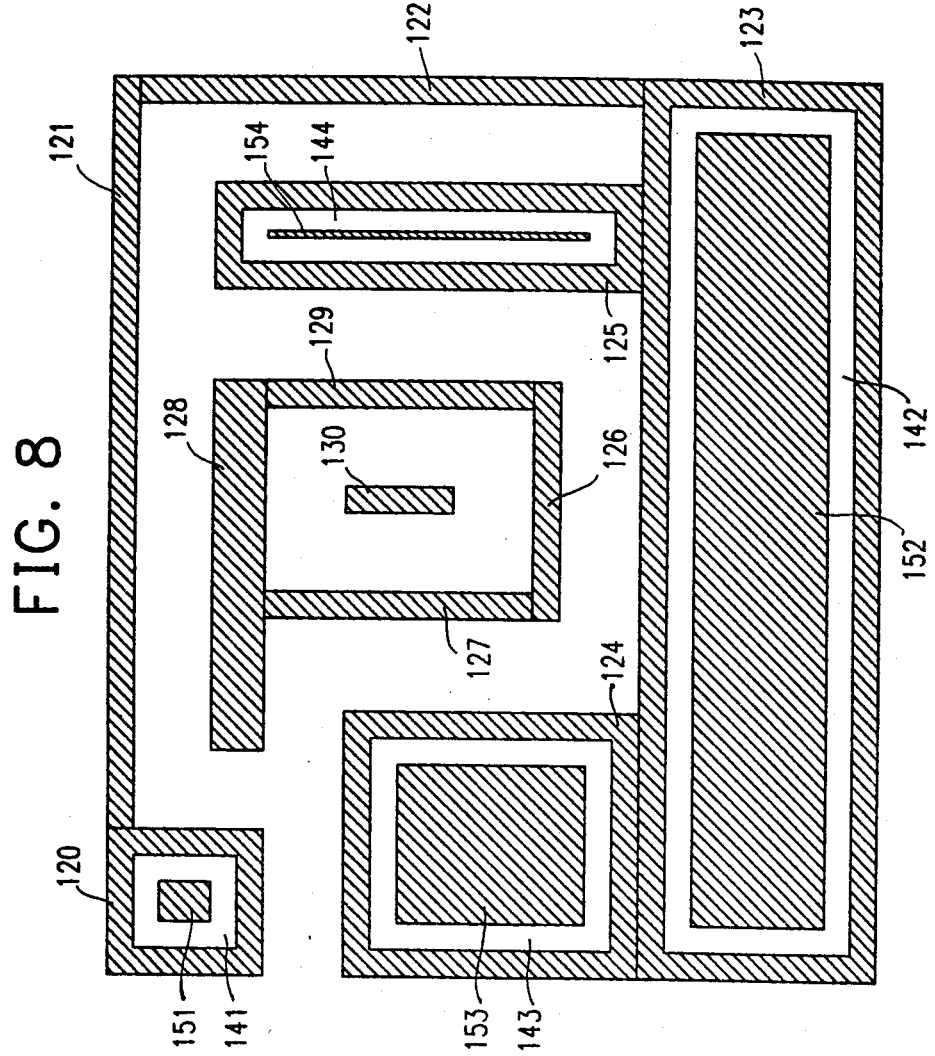
FIG. 8 illustrates a proximity corrected exposure pattern formed in accordance with this invention from the parts shown in FIG. 7.

FIGS. 2-5 illustrate an embodiment where perimeter part and central part subdividing is done before any edge biasing is done. It is also possible to do some of the edge biasing before subdividing the perimeter parts and central parts. This is shown in FIGS. 6-8. FIG. 6 illustrates a pattern 90 which exactly corresponds with the pattern of FIG. 1 except that an edge bias of one-quarter of the minimum linewidth has been applied to each existing edge. FIG. 6 corresponds with the exposure pattern generally employed by the prior art to yield the lithography pattern of FIG. 1. If proximity effect is to be avoided in accordance with prior art methods, the FIG. 6 pattern would be partitioned and different parts of the partitioned pattern would be exposed with different incident doses.

In accordance with this invention, the edge biased pattern (FIG. 6) may now be partitioned or not as desired. Since data handling requirements for very large patterns is eased by partitioning the pattern, the edge biased pattern is partitioned into rectangles in FIG. 7.

Partitionment into additional or other elementary shapes such as trapezoids, parallelograms, triangles, etc. is also possible. There are 11 rectangular shapes illustrated which are labelled 100-110. The partitioned shapes have also each been divided into a perimeter part and, if possible, a central part. The interfaces between perimeter parts and central parts are shown as dotted lines and are labelled 111-114. Perimeter parts are labelled 120-130. Central parts are labelled 131-134. The perimeter parts each have a width of one-half of the minimum pattern linewidth so that upon development with the assumed one-quarter of the minimum linewidth broadening, the perimeter exposure pattern lines become one linewidth wide.

Since edge bias was already applied to the pattern before it was subdivided into perimeter parts and central parts, no additional outside edge bias can be applied. Nominally unexposed bands will still be created, however, and they will still characteristically have a width of about two edge bias distances.

In accordance with this embodiment, the nominally unexposed bands are created entirely by double biasing the central regions. It should be recognized that as an alternative, the perimeter parts could have been defined as wider parts (three-quarters of a minimum linewidth for example) and then biased only along interface edges thereof.

FIG. 8 shows the completed exposure pattern in accordance with this embodiment. The perimeter parts 120-130 have not been further biased while the central parts have been biased twice as much the original pattern was biased to generate the FIG. 6 pattern. The original central parts 131-134 have been divided into nominally unexposed bands 141-144 and the central part exposure patterns 151-154. When a positive acting radiation sensitive layer is exposed to the proximity corrected exposure pattern consisting of the shaded parts shown in FIG. 8 and developed, the lithographic pattern shown in FIG. 1 is produced.

Figure 9:
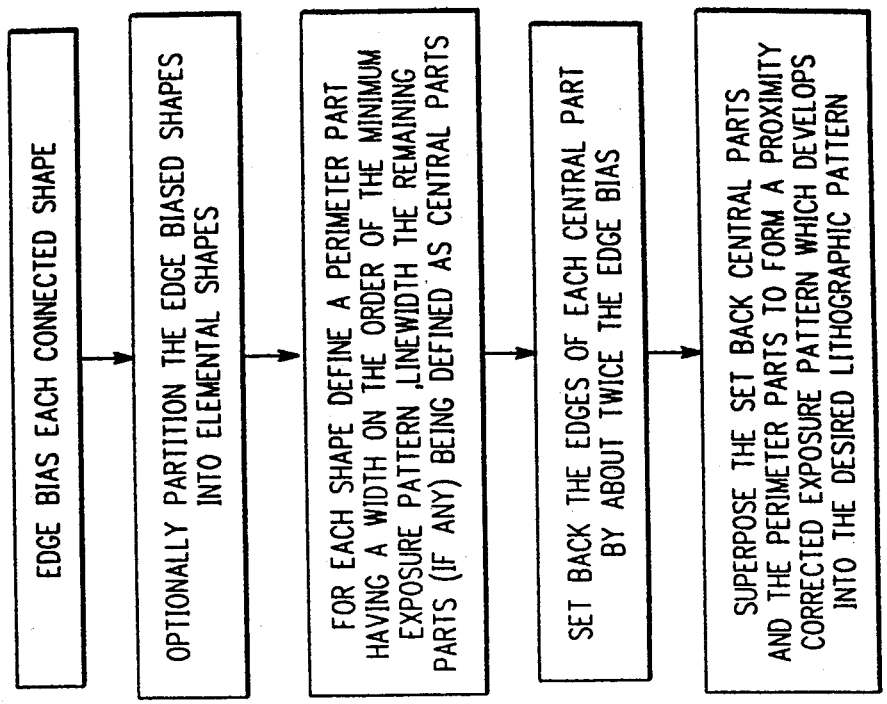
FIG. 9 is a block diagram of the method illustrated by FIG. 8.

The method used to produce the proximity corrected pattern of FIG. 8 is described by the block diagram of FIG. 9. First, the connected shapes of the desired lithographic pattern are edge biased. Then the edge biased pattern may be partitioned if desired. For each of the resulting shapes (either the partitioned shapes or the bias corrected connected shapes), a perimeter part is then defined having a width on the order of the minimum exposure pattern linewidth, the remaining parts (if any) being defined as central parts. Next, the edges of each central part are set back from the perimeter part which surrounds it to form a nominally unexposed band inside and adjacent to each perimeter part having a central part. The central part may or may not have a remaining interior part to expose depending upon the size of the central part. The set back of the edges of the central parts is preferably equal to about twice the bias distance. Finally, the perimeter parts and any remaining exposure portions of the central parts are superposed to form a proximity corrected exposure pattern.

Perimeter parts are defined in one embodiment before biasing and in the other embodiments after biasing. The width of perimeter band parts before biasing are obviously larger than the width will be after biasing. The preferred width for the perimeter band parts is such that the exposure pattern part corresponding with the perimeter band parts is equal to the exposure pattern minimum linewidth. Some variation is obviously possible in either direction. It is anticipated, however, that the width of perimeter exposure bands must be within an order of magnitude of the exposure pattern minimum linewidth to reduce proximity effect. It should be understood that the usual edge bias is not as large as was illustrated so that the minimum linewidth of the lithography pattern and the minimum linewidth of the exposure pattern used to produce the lithography pattern are usually close to each other. Accordingly, the width of the perimeter parts may instead be viewed as being on the order of the minimum linewidth of the lithography pattern rather than the exposure pattern. Negative active exposure and development processes are handled similarly to positive acting processes except that the original pattern which is then modified to a proximity corrected pattern is the inverse or negative of the desired lithographic pattern.

Certain modifications and variations in the described invention will be apparent to those of ordinary skill and may be made without departing from the spirit and scope of the present invention as defined by the following claims.

Having thus described my invention, what I claim as new, and desire to secure by Letters Patent is:

1. A method of modifying a lithographic exposure pattern so as to make the exposure pattern less sensitive to proximity effect, the exposure pattern consisting of a plurality of shapes, comprising the steps of:

subdividing the shapes of the lithographic exposure pattern into perimeter parts having a width on the order of the exposure pattern minimum linewidth and central parts, each central part being completely surrounded by a perimeter part; and modifying the exposure pattern by setting back the edges of each central part away from the perimeter part which surrounds it, thereby forming a nominally unexposed band inside of and immediately adjacent to each perimeter part having a central part, the nominally unexposed band acting to reduce electron scattering outside of the perimeter part adjacent thereto.

2. The method of claim 1 wherein the edges of each central part are set back as far as possible so long as the nominally unexposed bands formed thereby are each sufficiently narrow that upon direct exposure of a radiation sensitive layer to the modified exposure pattern, the nominally unexposed bands are exposed to electrons scattered from adjacent directly exposed parts and upon development thereof the nominally unexposed bands develop substantially as if each were directly exposed.

3. The method of claim 2 wherein the lithographic exposure pattern is edge biased before the shapes of the exposure pattern are subdivided into perimeter parts and central parts.

4. The method of claim 3 wherein central parts having a sufficiently narrow width are entirely removed to form nominally unexposed regions in place of the removed central parts.

5. The method of claim 4 wherein the entirely removed central parts have a width equal to or less than about twice the amount by which the pattern has been edge biased.

6. The method of claim 4 wherein the edges of each central part having sufficient size therefor are set back about twice the amount by which the pattern has been edge biased.

7. The method of claim 6 wherein central parts not entirely removed but also not sufficiently wide to have the edges thereof set back by about twice the edge bias amount are set back such that a remaining central part is formed of predetermined minimum width.

8. The method of claim 7 wherein the edges of central parts having a size larger than a predetermined size are set back more than twice the amount by which the pattern has been edge biased.

9. The method of claim 7 wherein central parts having a size larger than a predetermined size are broken further into perimeter subparts having a width on the order of the exposure pattern minimum linewidth and central subparts, each central subpart being completely surrounded by a perimeter subpart, and wherein the edges of each central subpart are set back from the perimeter subpart surrounding it, thereby forming a further nominally unexposed band inside of and immediately adjacent to each perimeter subpart.

10. The method of claim 3 wherein the amount by which the edges of central parts are set back generally increases with size of the central part.

11. The method of claim 3 wherein the perimeter parts each have a width about equal to the minimum linewidth of the exposure pattern.

12. The method of claim 2 wherein the lithographic exposure pattern is not edge biased before the shapes of the exposure pattern are subdivided into perimeter parts and central parts.

13. The method of claim 12 wherein the perimeter parts are edge biased as if the central parts were not part of the exposure pattern.

14. The method of claim 13 wherein the setting back of the edges of the central parts consists of edge biasing the central parts, each nominally unexposed band consisting of a central part outside edge bias and a perimeter part inside edge bias.

15. The method of claim 14 wherein the edges of each central part having sufficient size therefor are edge biased by the same amount as the perimeter parts are edge biased.

16. The method of claim 15 wherein central parts having a size larger than a predetermined size are edge biased more than perimeter parts are edge biased.

17. The method of claim 15 wherein central parts having a size larger than a predetermined size are subdivided further into perimeter subparts having a width on the order of the exposure pattern minimum linewidth and central subparts, each central subpart being completely surrounded by a perimeter subpart, and wherein the edges of each central subpart are set back from the perimeter subpart surrounding it, thereby forming a further nominally unexposed band inside and immediately adjacent to each perimeter subpart.

18. The method of claim 14 wherein the amount of the edge bias of central parts generally increases with the size of the central part.

19. The method of claim 1 wherein the lithographic exposure pattern is an electron beam exposure pattern.

* * * * *